(12) United States Patent
Meyer Timmerman Thijssen et al.

(10) Patent No.: US 12,669,635 B2
(45) Date of Patent: Jun. 30, 2026

(54) CONTROLLING ETCH ANGLES BY SUBSTRATE ROTATION IN ANGLED ETCH TOOLS

(71) Applicant: Applied Materials, Inc., Santa Clara, CA (US)

(72) Inventors: Rutger Meyer Timmerman Thijssen, Sunnyvale, CA (US); Morgan Evans, Manchester, MA (US); Joseph C. Olson, Beverly, MA (US)

(73) Assignee: Applied Materials, Inc., Santa Clara, CA (US)

( * ) Notice: Subject to any disclaimer, the term of this patent is extended or adjusted under 35 U.S.C. 154(b) by 895 days.

(21) Appl. No.: 17/737,723

(22) Filed: May 5, 2022

(65) Prior Publication Data

US 2022/0260764 A1 Aug. 18, 2022

Related U.S. Application Data

(63) Continuation of application No. 16/606,575, filed as application No. PCT/US2019/027828 on Apr. 17, (Continued)

(51) Int. Cl.
*G02B 5/18* (2006.01)
*H01J 37/20* (2006.01)
(Continued)

(52) U.S. Cl.
CPC ............ *G02B 5/1857* (2013.01); *H01J 37/20* (2013.01); *H01J 37/3023* (2013.01); (Continued)

(58) Field of Classification Search
CPC ........ G02B 5/1857; G02B 2006/12107; G02B 27/0101; G02B 27/4272; (Continued)

(56) References Cited

U.S. PATENT DOCUMENTS 4,405,405 A 9/1983 Fujii et al.
5,116,461 A 5/1992 Lebby et al.
(Continued)

FOREIGN PATENT DOCUMENTS

CN 1596368 A 3/2005
CN 103364857 A 10/2013
(Continued)

OTHER PUBLICATIONS

Machine translation of JP2003185819A (Year: 2003).*
(Continued)

*Primary Examiner* — Matthew Y Lee
(74) *Attorney, Agent, or Firm* — Patterson + Sheridan, LLP

(57) ABSTRACT

Embodiments described herein relate to methods of forming gratings with different slant angles on a substrate and forming gratings with different slant angles on successive substrates using angled etch systems. The methods include positioning portions of substrates retained on a platen in a path of an ion beam. The substrates have a grating material disposed thereon. The ion beam is configured to contact the grating material at an ion beam angle $\vartheta$ relative to a surface normal of the substrates and form gratings in the grating material. The substrates are rotated about an axis of the platen resulting in rotation angles $\phi$ between the ion beam and a surface normal of the gratings. The gratings have slant angles $\vartheta$ relative to the surface normal of the substrates. The rotation angles $\phi$ selected by an equation $\phi=\cos^{-1}(\tan(\vartheta)/\tan(\vartheta))$.

25 Claims, 6 Drawing Sheets

Related U.S. Application Data 2019, now Pat. No. 11,397,289, which is a continuation of application No. 15/993,135, filed on May 30, 2018, now Pat. No. 10,302,826.

(51) Int. Cl.

| | |
|---|---|
| *H01J 37/302* | (2006.01) |
| *H01J 37/305* | (2006.01) |
| *G02B 6/12* | (2006.01) |

(52) U.S. Cl.
CPC ...... *H01J 37/3053* (2013.01); *H01J 37/3056* (2013.01); *G02B 2006/12107* (2013.01); *H01J 2237/20207* (2013.01); *H01J 2237/20214* (2013.01); *H01J 2237/3151* (2013.01); *H01J 2237/3174* (2013.01)

(58) Field of Classification Search
CPC ........ G02B 2027/0109; G02B 27/0081; G02B 6/124; G02B 6/136; G02B 2006/12176; G02B 27/0172; G02B 6/0016; G02B 2027/0178; G02B 2027/0174; G02B 6/34; G02B 6/0038; G02B 5/1866; G02B 5/1871; G02B 6/005; G02B 6/0035; G02B 27/283; G02B 5/18; G02B 2005/1804; G02B 5/1819; G02B 2027/0118; G02B 6/0036; G02B 2027/014; G02B 5/1814

See application file for complete search history.

(56) References Cited

U.S. PATENT DOCUMENTS

| | | | | |
|---|---|---|---|---|
| 6,327,086 | B1 | 12/2001 | Unno | |
| 6,844,973 | B1 | 1/2005 | Koike et al. | |
| 11,035,988 | B1* | 6/2021 | Colburn | G02B 5/1857 |
| 2001/0026399 | A1 | 10/2001 | Nakabayashi et al. | |
| 2007/0041024 | A1 | 2/2007 | Gao et al. | |
| 2009/0224416 | A1* | 9/2009 | Laakkonen | G03F 7/0002 |
| | | | | 264/1.38 |
| 2012/0292535 | A1 | 11/2012 | Choi et al. | |
| 2013/0193106 | A1 | 8/2013 | Chen et al. | |
| 2013/0295703 | A1 | 11/2013 | Shi et al. | |
| 2014/0285891 | A1 | 9/2014 | Heitzmann | |
| 2016/0035539 | A1* | 2/2016 | Sainiemi | G02B 5/1857 |
| | | | | 204/298.36 |
| 2016/0231570 | A1* | 8/2016 | Levola | G02B 6/0035 |
| 2017/0003505 | A1 | 1/2017 | Vallius et al. | |
| 2017/0315346 | A1* | 11/2017 | Tervo | G02B 5/1819 |
| 2018/0239150 | A1* | 8/2018 | Yoshida | G02B 27/0172 |
| 2019/0212480 | A1* | 7/2019 | Evans | G02B 5/1819 |
| 2019/0258008 | A1* | 8/2019 | Hautala | B29D 11/00769 |
| 2020/0004029 | A1 | 1/2020 | Godet et al. | |
| 2020/0135482 | A1 | 4/2020 | Godet et al. | |
| 2020/0209630 | A1* | 7/2020 | Schultz | G02B 27/0081 |
| 2020/0408969 | A1* | 12/2020 | Yoon | G02B 5/18 |
| 2021/0027985 | A1 | 1/2021 | Olson et al. | |
| 2021/0247554 | A1 | 8/2021 | Meyer Timmerman Thijssen et al. | |
| 2021/0333450 | A1 | 10/2021 | Meyer Timmerman Thijssen et al. | |
| 2022/0082936 | A1 | 3/2022 | Franke et al. | |

FOREIGN PATENT DOCUMENTS

| | | | | |
|---|---|---|---|---|
| CN | 106662684 | A | | 5/2017 |
| JP | H06201909 | A | | 7/1994 |
| JP | H0815510 | A | | 1/1996 |
| JP | 2003022776 | A | | 1/2003 |
| JP | 2003185819 | A | * | 7/2003 |
| JP | 2012142398 | A | | 7/2012 |
| JP | 2009516225 | A | | 8/2013 |
| JP | 2013149750 | A | | 8/2013 |
| TW | M243670 | | | 9/2004 |
| TW | 201326768 | A | | 7/2013 |
| WO | 2008081555 | A1 | | 7/2008 |
| WO | 2019231576 | A1 | | 12/2019 |

OTHER PUBLICATIONS

International Search Report and Written Opinion, PCT/US2019/027828, Aug. 2, 2019.

Taiwan OA dated Jan. 9, 2020 for TW Application No. 08113938, 5 pages.

Taiwan Office Action Issued to 109106820 on Apr. 28, 2020.

Taiwan Allowance issued to 109106820 on Oct. 28, 2020.

Korean Office Action issued to Application No. 10-2020-7010610 on Dec. 14, 2021.

European Search Report issued to Application No. 19811777.2 on Feb. 18, 2022.

Japanese Office Action issued to Application No. 2020-565785 on Feb. 1, 2022.

Korean Office Action issued to Application No. 10-2020-7010610 on Aug. 26, 2022.

Chinese Office Action issued to Application No. 201980005019.6 on Mar. 3, 2023.

Japanese Office Action issued to Patent Application No. 2022-105857 on Aug. 15, 2023.

Korean Office Action issued to Patent Application No. 10-2023-7018095 on Jun. 14, 2023.

European Search Report issued to patent application No. 25160898.0 on Jun. 12, 2025.

Office Action from European Patent Application No. 25160898.0 dtd Apr. 29, 2026.

Office Action from Chinese Patent Application No. 202310663324.2 dated Apr. 29, 2026.

* cited by examiner

| | 5 |
| --- | --- |
| | 22.5 |
| | 45 |
| | 67.5 |
| | 85 |

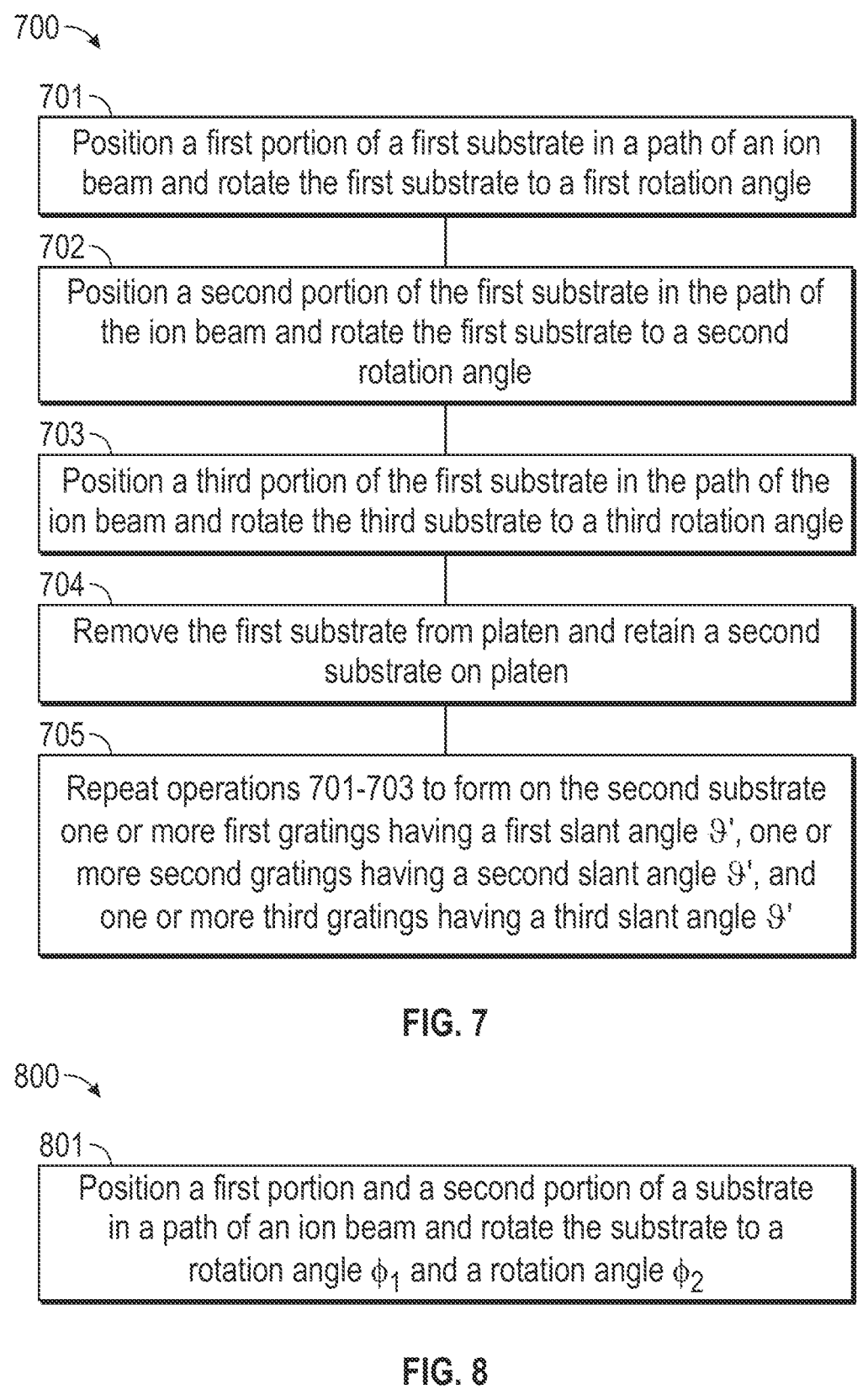

700

701
Position a first portion of a first substrate in a path of an ion beam and rotate the first substrate to a first rotation angle 702
Position a second portion of the first substrate in the path of the ion beam and rotate the first substrate to a second rotation angle 703
Position a third portion of the first substrate in the path of the ion beam and rotate the third substrate to a third rotation angle 704
Remove the first substrate from platen and retain a second substrate on platen 705
Repeat operations 701-703 to form on the second substrate one or more first gratings having a first slant angle $\vartheta'$, one or more second gratings having a second slant angle $\vartheta'$, and one or more third gratings having a third slant angle $\vartheta'$

801
Position a first portion and a second portion of a substrate in a path of an ion beam and rotate the substrate to a rotation angle $\phi_1$ and a rotation angle $\phi_2$

FIG. 8

CONTROLLING ETCH ANGLES BY SUBSTRATE ROTATION IN ANGLED ETCH TOOLS

CROSS-REFERENCE TO RELATED APPLICATIONS

This application is a continuation of co-pending U.S. patent application Ser. No. 16/606,575, filed Oct. 18, 2019, which is a US National Stage of International Application No. PCT/US2019/027828, filed Apr. 17, 2019, which is a continuation of U.S. patent application Ser. No. 15/993,135, filed on May 30, 2018. The entire contents of these applications are incorporated herein by reference in their entirety.

BACKGROUND

Field

Embodiments of the present disclosure generally relate to angled etch tools. More specifically, embodiments described herein provide for utilizing angled etch tools to form gratings with different slant angles.

Description of the Related Art

To form gratings with different slant angles on a substrate angled etch systems are used. Angled etch systems include an ion beam chamber that houses an ion beam source. The ion beam source is configured to generate an ion beam, such as a ribbon beam, a spot beam, or full substrate-size beam. The ion beam chamber is configured to direct the ion beam at an optimized angle relative to a surface normal of substrate. Changing the optimized angle requires reconfiguration of the hardware configuration of the ion beam chamber. The substrate is retained on a platen coupled to an actuator. The actuator is configured to tilt the platen, such that the substrate is positioned at a tilt angle relative to an axis of the ion beam chamber. The optimized angle and tilt angle result in an ion beam angle relative to the surface normal.

One example of a device that utilizes gratings with different slant angles is a light field display. Another example of a device that utilizes gratings with different slant angles is a waveguide combiner. A waveguide combiner may require gratings with slant angles that are different depending on the properties required of the augmented reality device. Additionally, a waveguide combiner may require gratings with different slant angles to adequately control the in-coupling and out-coupling of light. Successively fabricating waveguide combiners where the following waveguide combiner may have gratings with a different slant angle than a prior waveguide combiner and fabricating a waveguide combiner to have gratings with different slant angles relative the surface of the waveguide combiner using angled etch systems can be challenging.

Conventionally, to form gratings with different slant angles on a substrate or from gratings on multiple substrates with gratings having different slant angles, the optimized angle is changed, the tilt angle is changed, and/or multiple angled etch systems are used. Reconfiguring the hardware configuration of the ion beam chamber to change optimized angle is complex and requires reconfiguration time. Adjusting tilt angle to modify the ion beam angle results in non-uniform depths of gratings and using multiple angled etch systems increases the fabrication time and increases costs due the need of multiple chambers.

Accordingly, what needed in the art are methods of forming gratings with different slant angles on a substrate and forming gratings with different slant angles on successive substrates.

SUMMARY

In one embodiment, a grating forming method is provided. The method includes positioning a first portion of a first substrate retained on a platen in a path of an ion beam. The first substrate has a grating material disposed thereon. The ion beam is configured to contact the grating material at an ion beam angle $\vartheta$ relative to a surface normal of the first substrate and form one or more first gratings in the grating material. The first substrate retained on the platen is rotated about an axis of the platen resulting in a first rotation angle $\phi$ between the ion beam and the grating vector of the one or more first gratings. The one or more first gratings have a first slant angle $\vartheta'$ relative to the surface normal of the first substrate. The first rotation angle $\phi$ selected by an equation $\phi=\cos^{-1}(\tan(\vartheta')/\tan(\vartheta))$.

In another embodiment, a grating forming method is provided combiner fabrication method is provided. The method includes positioning a first portion of a first substrate retained on a platen in a path of an ion beam. The first substrate has a grating material disposed thereon. The ion beam is configured to contact the grating material at an ion beam angle $\vartheta$ relative to a surface normal of the first substrate and form one or more first gratings in the grating material. The first substrate retained on the platen is rotated about an axis of the platen resulting in a first rotation angle $\phi$ between the ion beam and a surface normal of the one or more first gratings. The one or more first gratings have a first slant angle $\vartheta'$ relative to the surface normal of the first substrate. The first rotation angle $\phi$ selected by an equation $\phi=\cos^{-1}(\tan(\vartheta')/\tan(\vartheta))$. A second portion of the first substrate is positioned in the path of the ion beam configured to form one or more second gratings in the grating material. The first substrate is rotated about the axis of the platen resulting in a second rotation angle $\phi$ between the ion beam and the surface normal of the one or more second gratings. The one or more second gratings have a second slant angle $\vartheta'$ relative to the surface normal of the first substrate. The second rotation angle $\phi$ selected by the equation $\phi=\cos^{-1}(\tan(\vartheta')/\tan(\vartheta))$. A third portion of the first substrate is positioned in the path of the ion beam configured to form one or more third gratings in the grating material. The first substrate is rotated about the axis of the platen resulting in a third rotation angle $\phi$ between the ion beam and the surface normal of the one or more third gratings. The one or more third gratings have a third slant angle $\vartheta'$ relative to the surface normal of the first substrate. The third rotation angle $\phi$ selected by the equation $\phi=\cos^{-1}(\tan(\vartheta')/\tan(\vartheta))$;

In yet another embodiment, a grating forming method is provided. The method includes positioning a first portion and a second portion of a substrate retained on a platen in a path of an ion beam. The substrate having a grating material disposed thereon, the ion beam configured to contact the grating material at an ion beam angle $\vartheta$ relative to a surface normal of the substrate and form one or more first gratings and one or more second gratings in the grating material. The substrate retained on the platen is rotated about an axis of the platen resulting in in a first rotation angle $\phi_1$ between the ion beam and a grating vector of the one or more first gratings and a second rotation angle $\phi2$ between the ion beam and a grating vector of the one or more second gratings. The one or more first gratings have a first slant angle $\vartheta'_1$ and the one or more second gratings have a second slant angle $\vartheta'_2$ relative to the surface normal of the substrate. The first rotation angle $\phi_1$ and the second rotation angle $\phi_2$ are selected by a system of equations $\vartheta = \arctan(\tan(\vartheta'_1)/\cos(\phi_1))$, $\vartheta = \arctan(\tan(\vartheta'_2)/\cos(\phi_2))$, and $\Delta\phi = \phi_2 - \phi_1$.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

FIG. 7 is a flow diagram of a method for forming gratings with different slant angles according to an embodiment.

FIG. 8 is a flow diagram of a method for forming portions of gratings having different slant angles with a single pass according to an embodiment.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments described herein relate to methods of forming gratings with different slant angles on a substrate and forming gratings with different slant angles on successive substrates. The methods include positioning portions of substrates retained on a platen in a path of an ion beam. The substrates have a hardmask disposed thereon. The ion beam is configured to contact the hardmask at an ion beam angle $\vartheta$ relative to a surface normal of the substrates and form gratings in the hardmask. The substrates are rotated about an axis of the platen resulting in rotation angles $\phi$ between the ion beam and a surface normal of the gratings. The gratings have slant angles $\vartheta'$ relative to the surface normal of the substrates. The rotation angles $\phi$ selected by an equation $\phi = \cos^{-1}(\tan(\vartheta')/\tan(\vartheta))$. In one embodiment, forming gratings with different slant angles on substrate forms a waveguide combiner or a master of a waveguide combiner for nanoimprint lithography processing.

Figure 1:
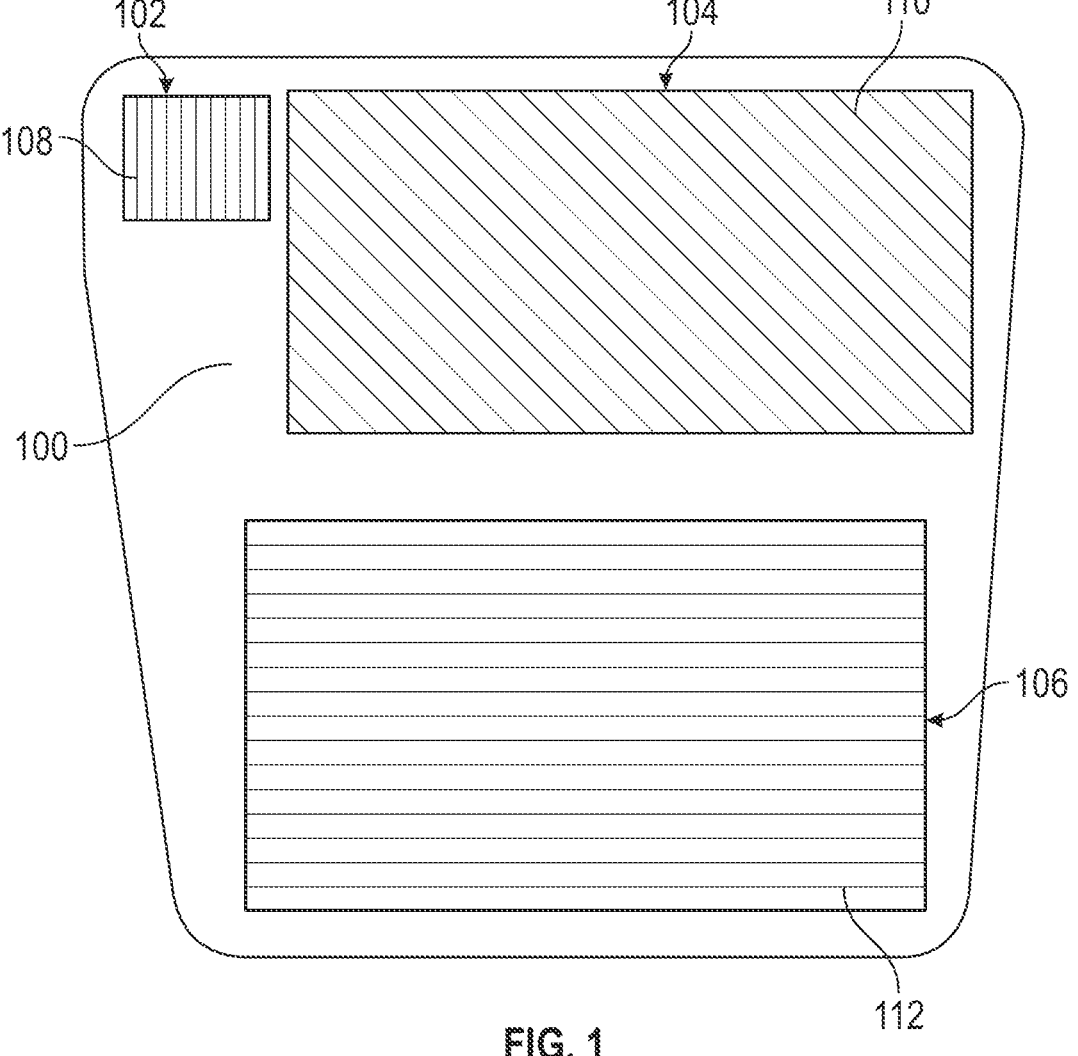
FIG. 1 is a perspective, frontal view of a waveguide combiner according to an embodiment.

FIG. 1 is a perspective, frontal view of a waveguide combiner 100. It is to be understood that the waveguide combiner 100 described below is an exemplary waveguide combiner. The waveguide combiner 100 includes an input coupling region 102 defined by a plurality gratings 108, an intermediate region 104 defined by a plurality of gratings 110, and an output coupling region 106 defined by a plurality of gratings 112. The input coupling region 102 receives incident beams of light (a virtual image) having an intensity from a microdisplay. Each grating of the plurality of gratings 108 splits the incident beams into a plurality of modes, each beam having a mode. Zero-order mode (T0) beams are refracted back or lost in the waveguide combiner 100, positive first-order mode (T1) beams are coupled though the waveguide combiner 100 to the intermediate region 104, and negative first-order mode (T-1) beams propagate in the waveguide combiner 100 a direction opposite to the T1 beams. Ideally, the incident beams are split into T1 beams that have all of the intensity of the incident beams in order to direct the virtual image to the intermediate region 104. One approach to split the incident beam into T1 beams that have all of the intensity of the incident beams is to optimize the slant angle of each grating of the plurality of gratings 108 to suppress the T-1 beams and the T0 beams. The T1 beams undergo total-internal-reflection (TIR) through the waveguide combiner 100 until the T1 beams come in contact with the plurality of gratings 110 in the intermediate region 104. A portion of the input coupling region 102 may have gratings 108 with a slant angle different than the slant angle of gratings 108 from an adjacent portion of the input coupling region 102.

The T1 beams contact a grating of the plurality of gratings 110. The T1 beams are split into T0 beams refracted back or lost in the waveguide combiner 100, T1 beams that undergo TIR in the intermediate region 104 until the T1 beams contact another grating of the plurality of gratings 110, and T-1 beams that are coupled through the waveguide combiner 100 to the output coupling region 106. The T1 beams that undergo TIR in the intermediate region 104 continue to contact gratings of the plurality of gratings 110 until the either the intensity of the T1 beams coupled through the waveguide combiner 100 to the intermediate region 104 is depleted, or remaining T1 beams propagating through the intermediate region 104 reach the end of the intermediate region 104. The plurality of gratings 110 must be tuned to control the T1 beams coupled through the waveguide combiner 100 to the intermediate region 104 in order to control the intensity of the T-1 beams coupled to the output coupling region 106 to modulate a field of view of the virtual image produced from the microdisplay from a user's perspective and increase a viewing angle from which a user can view the virtual image. One approach to control the T1 beams coupled through the waveguide combiner 100 to the intermediate region 104 is to optimize the slant angle of each grating of the plurality of gratings 110 to control the intensity of the T-1 beams coupled to the output coupling region 106. A portion of the intermediate region 104 may have gratings 110 with a slant angle different than the slant angle of gratings 110 from an adjacent portion of the intermediate region 104. Furthermore, the gratings 110 may have slant angles different that the slant angles of the gratings 108.

The T-1 beams coupled through the waveguide combiner 100 to the output coupling region 106 undergo TIR in the waveguide combiner 100 until the T-1 beams contact a grating of the plurality of gratings 112 where the T-1 beams are split into T0 beams refracted back or lost in the waveguide combiner 100, T1 beams that undergo TIR in the output coupling region 106 until the T1 beams contact another grating of the plurality of gratings 112, and T-1 beams coupled out of the waveguide combiner 100. The T1 beams that undergo TIR in the output coupling region 106 continue to contact gratings of the plurality of gratings 112 until the either the intensity of the T-1 beams coupled through the waveguide combiner 100 to the output coupling region 106 is depleted, or remaining T1 beams propagating through the output coupling region 106 have reached the end of the output coupling region 106. The plurality of gratings 112 must be tuned to control the T-1 beams coupled through the waveguide combiner 100 to the output coupling region 106 in order to control the intensity of the T-1 beams coupled out of the waveguide combiner 100 to further modulate the field of view of the virtual image produced from the microdisplay from the user's perspective and further increase the viewing angle from which the user can view the virtual image. One approach to control the T-1 beams coupled through the waveguide combiner 100 to the output coupling region 106 is to optimize the slant angle of each grating of the plurality of gratings 112 to further modulate the field of view and increase the viewing angle. A portion of the intermediate region 104 may have gratings 110 with a slant angle different than the slant angle of gratings 110 from an adjacent portion of the intermediate region 104. Furthermore, the gratings 112 may have slant angles different that the slant angles of the gratings 108 and the gratings 110.

Figure 2A:
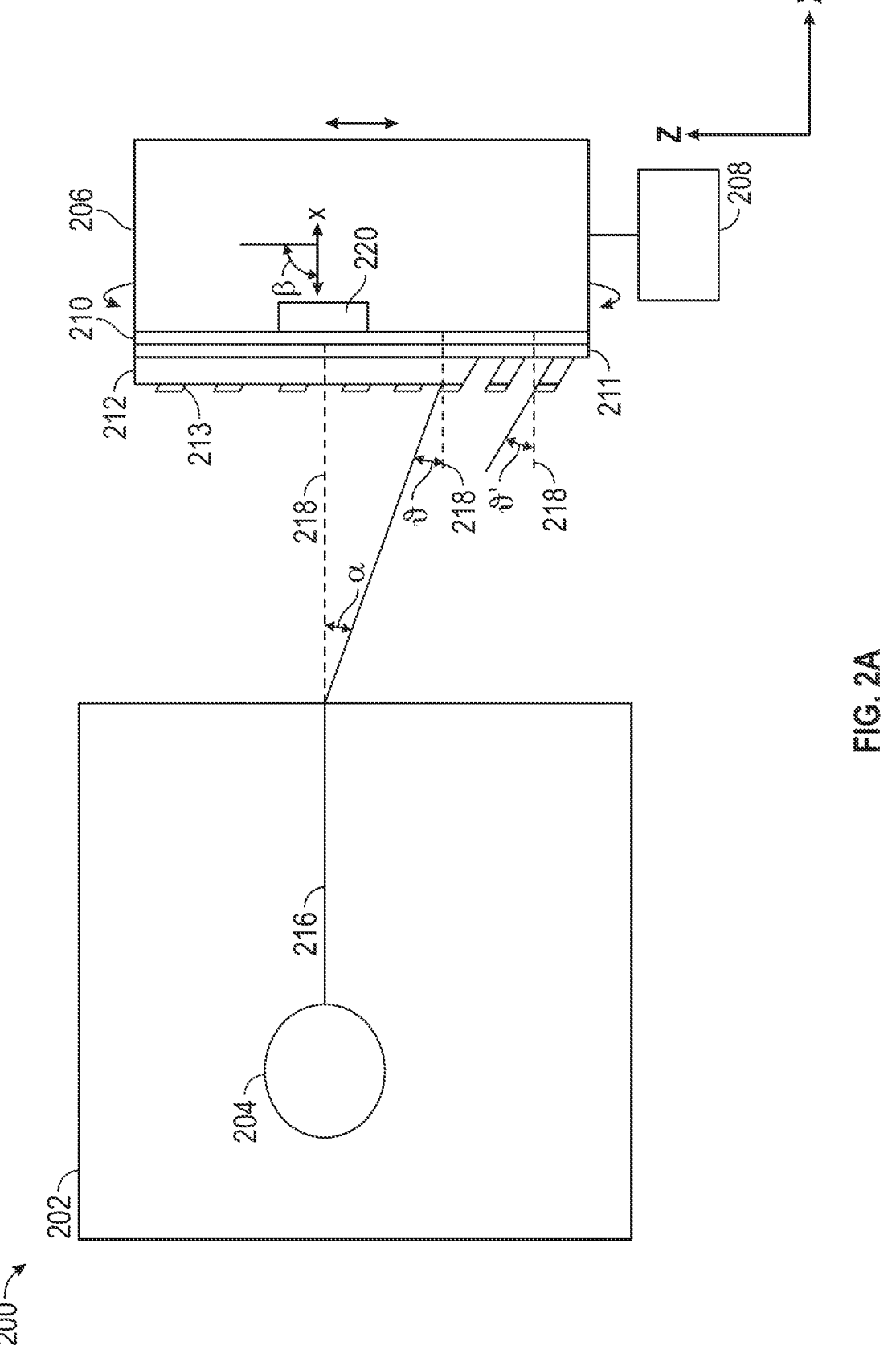
FIG. 2A is a side, schematic cross-sectional of an angled etch system according to an embodiment.
Figure 2B:
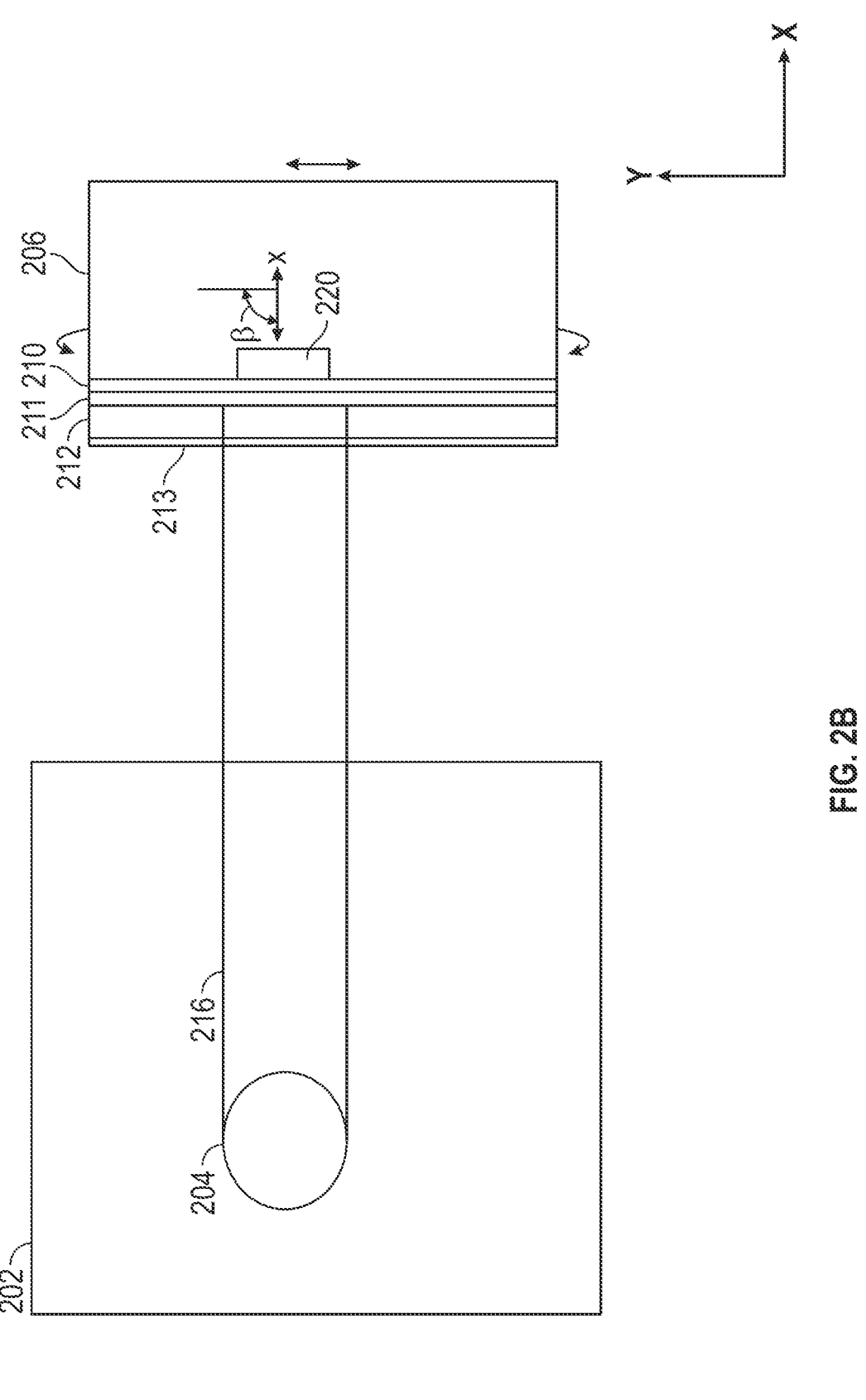
FIG. 2B is side, schematic cross-sectional view of an angled etch system according to an embodiment.

FIG. 2A is a side, schematic cross-sectional view and FIG. 2B is side, schematic cross-sectional view of an angled etch system 200, such as the Varian VIISta® system available from Applied Materials, Inc. located in Santa Clara, Calif. It is to be understood that the angled etch system described below is an exemplary angled etch system and other angled etch system, including angled etch system from other manufacturers, may be used with or modified to form gratings on a substrate.

To form gratings having slant angles, a grating material 212 disposed on a substrate 210 is etched by the angled etch system 200. In one embodiment, the grating material 212 is disposed on an etch stop layer 211 disposed on the substrate 210 and a patterned hardmask 213 is disposed over the grating material 212. In one embodiment, the materials of grating material 212 are selected based on the slant angle $\vartheta'$ of each grating and the refractive index of the substrate 210 to control the in-coupling and out-coupling of light and facilitate light propagation through a waveguide combiner. In another embodiment, the grating material 212 includes silicon oxycarbide (SiOC), titanium dioxide ($TiO_2$), silicon dioxide ($SiO_2$), vanadium (IV) oxide (VOx), aluminum oxide ($Al_2O_3$), indium tin oxide (ITO), zinc oxide (ZnO), tantalum pentoxide ($Ta_2O_5$), silicon nitride ($Si_3N_4$), titanium nitride (TiN), and/or zirconium dioxide ($ZrO_2$) containing materials. The grating material 212 has a refractive index between about 1.5 and about 2.65. In yet another embodiment, the patterned hardmask 213 is a non-transparent hardmask that is removed after the waveguide combiner is formed. For example, the non-transparent hardmask includes reflective materials, such as chromium (Cr) or silver (Ag). In another embodiment, the patterned hardmask 213 is a transparent hardmask. In one embodiment, the etch stop layer 211 is a non-transparent etch stop layer that is removed after the waveguide combiner is formed. In another embodiment, the etch stop layer 211 is a transparent etch stop layer.

The angled etch system 200 includes an ion beam chamber 202 that houses an ion beam source 204. The ion beam source is configured to generate an ion beam 216, such as a ribbon beam, a spot beam, or full substrate-size beam. The ion beam chamber 202 is configured to direct the ion beam 216 at an optimized angle $\alpha$ relative to a surface normal 218 of substrate 210. Changing the optimized angle $\alpha$ requires reconfiguration of the hardware configuration of the ion beam chamber 202. The substrate 210 is retained on a platen 206 coupled to a first actuator 208. The first actuator 208 is configured to move the platen 206 in a scanning motion along a y-direction and/or a z-direction. In one embodiment, the actuator is further configured to tilt the platen 206, such that the substrate 210 is positioned at a tilt angle $\beta$ relative to the x-axis of the ion beam chamber 202. The optimized angle $\alpha$ and tilt angle $\beta$ result in an ion beam angle $\vartheta$ relative to the surface normal 218. To form gratings having a slant angle $\vartheta'$ relative the surface normal 218, the ion beam source 204 generates an ion beam 216 and the ion beam chamber 202 directs the ion beam 216 towards the substrate 210 at the optimized angle $\alpha$. The first actuator 208 is positions the platen 206 so that the ion beam 216 contacts the grating material 212 at the ion beam angle $\vartheta$ and etches gratings having a slant angle $\vartheta'$ on desired portions of the grating material 212.

Conventionally, to form a portion of gratings with a slant angle $\vartheta'$ than different than the slant angle $\vartheta'$ of an adjacent portion of gratings or form gratings having a different slant angle $\vartheta'$ on multiple substrates, the optimized angle $\alpha$ is changed, the tilt angle $\beta$ is changed, and/or multiple angled etch systems are used. Reconfiguring the hardware configuration of the ion beam chamber 202 to change optimized angle $\alpha$ is complex and requires reconfiguration time. Adjusting tilt angle $\beta$ to modify the ion beam angle $\vartheta$ results in non-uniform depths of gratings at portions of the substrate 210 as the ion beam 216 contacts the grating material 212 at a different energy levels. For example, a portion positioned closer to the ion beam chamber 202 will have gratings with a greater depth than gratings of an adjacent portion positioned further away from the ion beam chamber 202. Using multiple angled etch systems increases the fabrication time and increases costs due the need of multiple chambers. To avoid the reconfiguring the ion beam chamber 202, adjusting the tilt angle $\beta$ to modify the ion beam angle $\vartheta$, and using multiple angled etch systems, the angled etch system 200 includes a second actuator 220 coupled to the platen 206 to rotate the substrate 210 about the x-axis of the platen 206 to control the slant angle $\vartheta'$ of gratings.

Figures 3, 4:
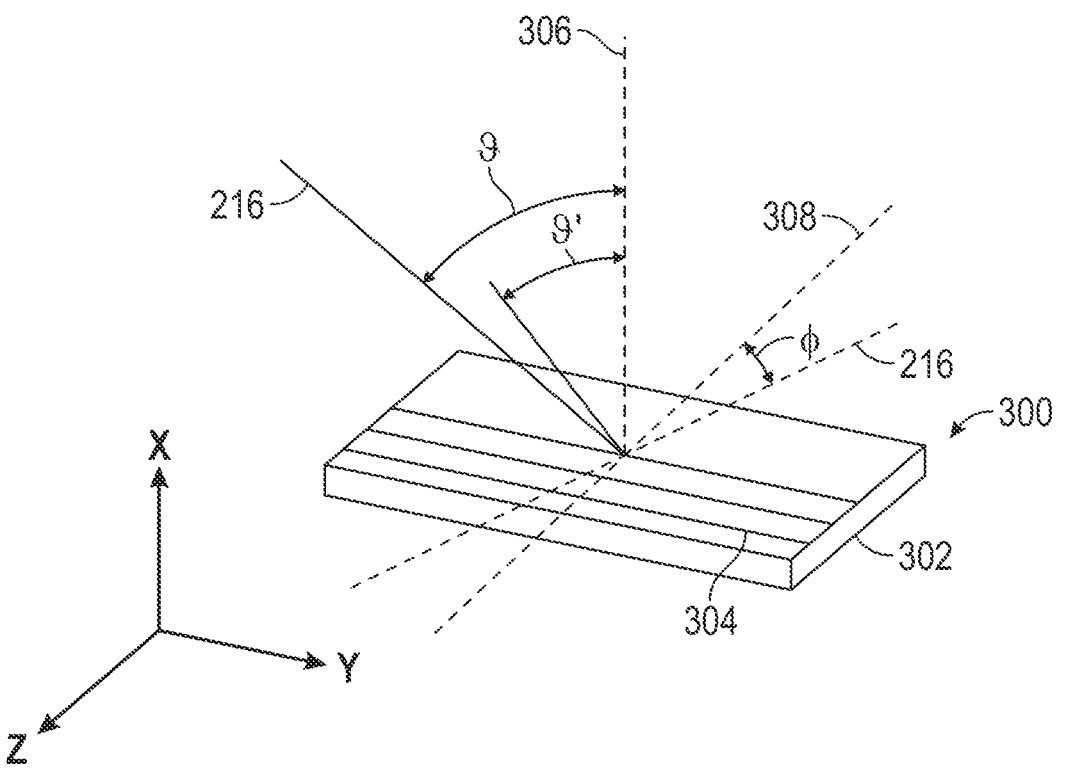
FIG. 3 is a schematic perspective view of a portion of a substrate according to an embodiment.
FIG. 4 is a graph of the results of the equivalent slant angle $\vartheta'$ equations according to an embodiment.

FIG. 3 is a schematic perspective view of a portion 300 of a substrate 302. The tilt angle $\beta$ and optimized angle $\alpha$ of the ion beam 216 are fixed such that the ion beam angle $\vartheta$ relative a surface normal 306 of the substrate 302 is constant. The optimized angle $\alpha$ is between about 0° and about 90° and the tilt angle $\beta$ is between about 0° and about 30°. The resulting ion beam angle $\vartheta$ is between about 0° and about 90°. The ion beam angle $\vartheta$ is preferably between about 25° and about 75° as a ion beam angle $\vartheta$ close to about 0° or about 90° will result in gratings 304 having a slant angle $\vartheta'$ of about 0° or about 90° such that the gratings 304 are not slanted. The substrate 302 is rotated about the x-axis of the platen 206 resulting in rotation angle $\phi$ between the ion beam 216 and a grating vector 308 of the gratings 304. The rotation angle $\phi$ is selected to control the slant angle $\vartheta'$ without reconfiguring the ion beam chamber 202, without adjusting the tilt angle $\beta$ to modify the ion beam angle $\vartheta$, and without using multiple angled etch systems. To determine the resulting slant angle $\vartheta'$ with a fixed ion beam angle $\vartheta$ one of the following equivalent slant angle $\vartheta'$ equations are implemented: $\sin(\vartheta')=\sin(\vartheta)/\sqrt{1+\tan^2(\phi)*\cos^2(\vartheta)}$ and $\tan(\vartheta')=\tan(\vartheta)*\cos(\phi)$. Solving for $\phi$, the rotation angle $\phi$ is $\cos^{-1}(\tan(\vartheta')/\tan(\vartheta))$. For example, if the ion beam angle $\vartheta$ is 45° and the desired slant angle $\vartheta'$ is 22.5° the rotation angle $\phi$ is about 65.53° as $\cos^{-1}(\tan(22.5)/\tan(45))=65.53$. FIG. 4 is a graph of the results of the equivalent slant angle $\vartheta'$ equations for ion beam angles $\vartheta$ of 5°, 22.5°, 45°, 67.5°, and 85° as a function of rotation angle $\phi$. Error In one embodiment, gratings 304 having a slant angle $\vartheta'$ can be formed with the angled etch system 200. In another embodiment, gratings 304 having a slant angle $\vartheta'$ can be formed with an ion beam etch system, also known as full wafer, immersive, or gridded etch system, having a ion beam source 204 housed in a ion beam chamber 202 that generates an ion beam 216 having a geometry corresponding to the geometry of the surface of the substrate 302 at an optimized angle $\alpha$ of about 0°. The platen 206 of the ion beam etch system is configured to position the substrate 210 at a tilt angle $\beta$ so that the ion beam 216 contacts the substrate 302 at an ion beam angle $\vartheta$ between about 25° and about 75°. The rotation angle $\phi$ is selected to control the slant angle $\vartheta'$ as described herein.

Figure 5:
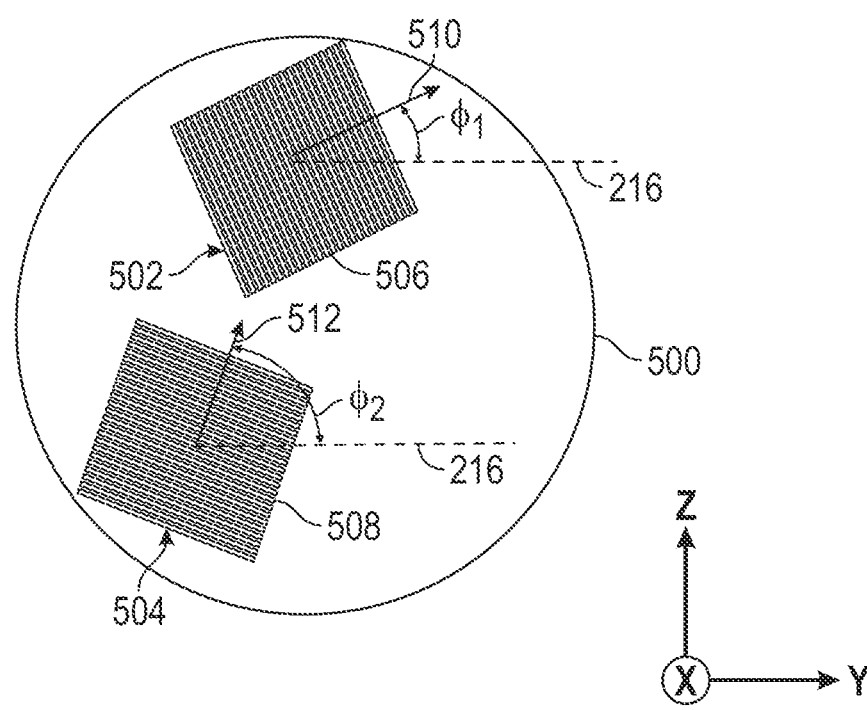
FIG. 5 is a schematic top view of a substrate having a first portion of gratings and a second portion of gratings according to an embodiment.

FIG. 5 is a schematic top view of a substrate 500 having a first portion 502 of gratings 506 and a second portion 504 of gratings 508. The tilt angle $\beta$ and optimized angle $\alpha$ of the ion beam 216 are fixed such that the ion beam angle $\vartheta$ relative a surface normal of the substrate 500 is constant. The optimized angle $\alpha$ is between about 0° and about 90° and the tilt angle $\beta$ is between about 0° and about 30°. The resulting ion beam angle $\vartheta$ is between about 0° and about 90°. The ion beam angle $\vartheta$ is preferably between about 25° and about 75° as a ion beam angle $\vartheta$ close to about 0° or about 90° will result in the gratings 506 having a slant angle $\vartheta'_1$ and the gratings 506 having a slant angle $\vartheta'_2$ of about 0° or about 90° such that the gratings 506 and the gratings 508 are not slanted. The substrate 500 is rotated about the x-axis of the platen 206 resulting in a rotation angle $\phi_1$ between the ion beam 216 and a grating vector 510 of the gratings 506 and a rotation angle $\phi_2$ between the ion beam 216 and a grating vector 512 of the gratings 508. The rotation angle $\phi_1$ is selected to form gratings 506 having slant angle $\vartheta'_1$ and the rotation angle $\phi_2$ is selected to form gratings 508 having slant angle $\vartheta'_2$ with by moving the platen 206 in the scanning motion with a single pass traversing the ion beam chamber 202 such that the first portion 502 and second portion 504 are positioned in the path of the ion beam 216. To form two or more portions of gratings with a single pass of the platen 206 traversing the ion beam chamber 202 the following system of equations is implemented:

$$\vartheta = \arctan(\tan(\vartheta'_1)/\cos(\phi_1))$$

$$\vartheta = \arctan(\tan(\vartheta'_2)/\cos(\phi_2))$$

$$\Delta\phi = \phi_2 - \phi_1$$

Figure 6:
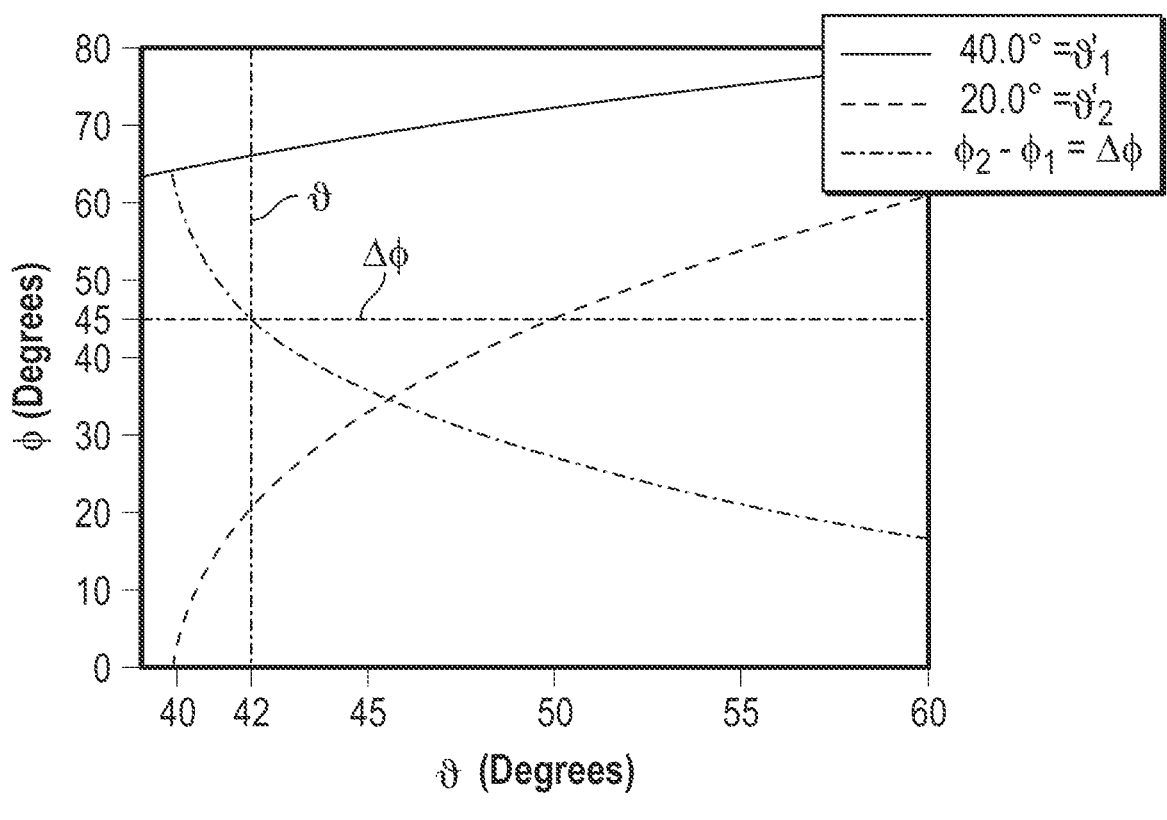
FIG. 6 is a graph of the results of the system of equations for the rotation according to an embodiment.

In one embodiment, the slant angle $\vartheta'_1$, the slant angle $\vartheta'_2$, and the $\Delta\phi$ are known. Solving the system of equations for the rotation angle $\phi_1$, the rotation angle $\phi_2$, and ion beam angle $\vartheta$ will allow for the formation of the gratings 506 having the slant angle $\vartheta'_1$ and the gratings 508 the having slant angle $\vartheta'_2$ with a single pass of the platen 206 traversing the ion beam chamber 202. FIG. 6 is a graph of the results of the system of equations for the rotation angle $\phi_1$, the rotation angle $\phi_2$, and the ion beam angle $\vartheta$. To form gratings 506 having a slant angle $\vartheta'_1$ of 40° and gratings 508 having a slant angle $\vartheta'_2$ of 20° with a $\Delta\phi$ of 45° a rotation angle $\phi_1$ of 21.1° and the rotation angle $\phi_2$ of 61.1° will from the first portion 502 and second portion 504 with a single pass of the platen 206 traversing the ion beam chamber 202. In another embodiment, the ion beam angle $\vartheta$, the slant angle $\vartheta'_1$, the slant angle $\vartheta'_2$, and the $\Delta\phi$ are known and the system of equations is solved for the rotation angle $\phi_1$ and the rotation angle $\phi_2$. Thus, the gratings 506 having the slant angle $\vartheta'_1$ and the gratings 508 having slant angle $\vartheta'_2$ are formed with a single pass of the platen 206 traversing the ion beam chamber 202 without reconfiguring the ion beam chamber 202, without adjusting the tilt angle $\beta$ to modify the ion beam angle $\vartheta$, and without using multiple angled etch systems. Additionally, the system of equations may be extended to form three or more portions of gratings.

FIG. 7 is a flow diagram of a method 700 for forming gratings with different slant angles. In one embodiment, the method 700 is performed by the angled etch system 200. In another embodiment, the method 700 is performed by an ion beam etch system. The angled etch system 200 includes an ion beam source 204 that generates the ion beam 216, such as a ribbon beam or a spot beam, housed in a ion beam chamber 202. The ion beam chamber 202 is configured to direct the ion beam 216 at an optimized angle $\alpha$ relative to the surface normal 218 of substrate 210. A first actuator 208 coupled to the platen 206 is configured to move the substrate 210 in a scanning motion and tilt the platen 206, such that the substrate 210 is positioned at a tilt angle $\beta$ relative to an axis of the ion beam chamber 202. The first actuator 208 is configured to move the platen 206 in the scanning motion along the y-direction and/or the z-direction. The optimized angle $\alpha$ and tilt angle $\beta$ result in an ion beam angle $\vartheta$ relative to the surface normal 218.

At operation 701, a first portion of a first substrate having a grating material 212 disposed thereon is positioned in a path of an ion beam 216. The ion beam 216 contacts the grating material 212 at an ion beam angle $\vartheta$ relative to a surface normal 218 of the first substrate and forms one or more first gratings in the grating material 212. The first substrate is retained on a platen 206 configured to position the first portion in the path of the ion beam 216 and to rotate the first substrate about an axis of the platen 206 resulting in a first rotation angle $\phi$ between the ion beam 216 and a grating vector 308 of the one or more first gratings. The first rotation angle $\phi$ is selected to result in the one or more first gratings having a first slant angle $\vartheta'$ relative to the surface normal 218 of the substrate. The first rotation angle $\phi$ is selected by the rotation angle $\phi$ equation of $\phi=\cos^{-1}(\tan(\vartheta')/\tan(\vartheta))$. In one embodiment, the first portion corresponds to the input coupling region 102 of the waveguide combiner 100.

To form one or more second gratings on a second portion of the first substrate or a portion of a second substrate with a second slant angle $\vartheta'$ different than the first slant angle $\vartheta'$ without reconfiguring the ion beam chamber 202 to change the optimized angle $\alpha$, adjusting the tilt angle $\beta$ to modify the ion beam angle $\vartheta$, and using multiple angled etch systems, the optimized angle $\alpha$ and tilt angle $\beta$ remain constant while the first substrate or second substrate is rotated by a second actuator 220 coupled to the platen 206 configured to rotate a substrate about the axis of the platen 206.

At operation 702, a second portion of the first substrate having the grating material 212 disposed thereon is positioned in the path of the ion beam 216. The ion beam 216 contacts the grating material 212 at the ion beam angle $\vartheta$ relative to the surface normal 218 of the first substrate and forms one or more second gratings in the grating material 212. The second portion is positioned in the path of the ion beam 216 and the first substrate is rotated about the axis of the platen 206 resulting in a second rotation angle $\phi$ between the ion beam 216 and a grating vector 308 of the one or more second gratings. The second rotation angle $\phi$ is selected to result in the one or more second gratings having a second slant angle $\vartheta'$ relative to the surface normal 218 of the substrate. The second rotation angle $\phi$ is selected by the rotation angle $\phi$ equation of $\phi=\cos^{-1}(\tan(\vartheta')/\tan(\vartheta))$. In one embodiment, the second portion corresponds to the intermediate region 104 of the waveguide combiner 100.

At operation 703, a third portion of a first substrate having the grating material 212 disposed thereon is positioned in the path of the ion beam 216, the ion beam 216 contacts the grating material 212 at the ion beam angle $\vartheta$ relative to the surface normal 218 of the first substrate and forms one or more third gratings in the grating material 212. The third portion is positioned in the path of the ion beam 216 and the first substrate is rotated about the axis of the platen 206 resulting in a third rotation angle $\phi$ between the ion beam 216 and a grating vector 308 of the one or more third gratings. The third rotation angle $\phi$ is selected to result in the one or more third gratings having a third slant angle $\vartheta'$ relative to the surface normal 218 of the substrate. The third rotation angle $\phi$ is selected by the rotation angle $\phi$ equation of $\phi=\cos^{-1}(\tan(\vartheta')/\tan(\vartheta))$. In one embodiment, the third portion corresponds to the output coupling region 106 of the waveguide combiner 100.

At operation 704, the first substrate is removed and a second substrate is retained on the platen. At operation 605, operations 701-703 are repeated to form on a second substrate one or more first gratings having a first slant angle $\vartheta'$, one or more second gratings having a second slant angle $\vartheta'$ different than the first slant angle $\vartheta'$, and one or more third gratings having a third slant angle $\vartheta'$ different than the first slant angle $\vartheta'$ and the second slant angle $\vartheta'$.

FIG. 8 is a flow diagram of a method 800 for forming portions of gratings having different slant angles with a single pass of the platen 206 traversing the ion beam chamber 202. At operation 801 a first portion 502 and a second portion 504 of a substrate 500 having a grating material 212 disposed thereon is positioned in a path of an ion beam 216 with a single pass of the platen 206 traversing the ion beam chamber 202. The ion beam 216 contacts the grating material at an ion beam angle $\vartheta$ relative to a surface normal 218 of the substrate 500 and forms one or more gratings 506 and one or more gratings 508 in the grating material. The substrate 500 is retained on a platen 206 configured to position the first portion 502 and second portion 504 in the path of the ion beam 216 and to rotate the substrate 500 about an axis of the platen 206 resulting in a rotation angle $\phi_1$ between the ion beam 216 and a grating vector 510 of the one or more gratings 506 and a rotation angle $\phi2$ between the ion beam 216 and a grating vector 512 of the one or more gratings 508. The rotation angle $\phi_1$ is selected to result in the one or more gratings 506 having a slant angle $\vartheta'_1$ relative to the surface normal 218 of the substrate. The rotation angle $\phi_2$ is selected to result in the one or more gratings 508 having a slant angle $\vartheta'_2$ relative to the surface normal 218 of the substrate. The rotation angle $\phi_1$ and the rotation angle $\phi_2$ are selected by solving the system of equations:

$$\vartheta = \arctan(\tan(\vartheta'_1)/\cos(\phi_1))$$

$$\vartheta = \arctan(\tan(\vartheta'_2)/\cos(\phi_2))$$

$$\Delta\phi = \phi_2 - \phi_1$$

In one embodiment, the slant angle $\vartheta'_1$, the slant angle $\vartheta'_2$, and the $\Delta\phi$ are known. Solving the system of equations for the rotation angle $\phi_1$, the rotation angle $\phi_2$ and ion beam angle $\vartheta$ will allow for the formation of the gratings 506 having the slant angle $\vartheta'_1$ and the gratings 508 the having slant angle $\vartheta'_2$ with a single pass of the platen 206 traversing the ion beam chamber 202. In another embodiment, the ion beam angle $\vartheta$, the slant angle $\vartheta'_1$, the slant angle $\vartheta'_2$, and the $\Delta\phi$ are known and the system of equations is solved for the rotation angle $\vartheta_1$ and the rotation angle $\phi_2$. Thus, the gratings 506 having the slant angle $\vartheta'_1$ and the gratings 508 the having slant angle $\vartheta'_2$ are formed with a single pass of the platen 206 traversing the ion beam chamber 202 without reconfiguring the ion beam chamber 202, without adjusting the tilt angle $\beta$ to modify the ion beam angle $\vartheta$, and without using multiple angled etch systems. Additionally, the system of equations may be extended to form three or more portions of gratings. The method 800 may be repeated for subsequent substrates.

In summation, methods of successively forming gratings with different slant angles on a substrate and forming gratings with different slant angles on successive substrates using angled etch systems is described herein. The utilization of selecting the rotation angle $\phi$ to control the slant angle $\vartheta'$ without reconfiguring the ion beam chamber, adjusting the tilt angle $\beta$ to modify the ion beam angle $\vartheta$, and using multiple angled etch systems allows a singled angled etch system to fabricate waveguide combiners and fabricate a waveguide combiner having gratings with different slant angles $\vartheta'$.

While the foregoing is directed to examples of the present disclosure, other and further examples of the disclosure may be devised without departing from the basic scope thereof, and the scope thereof is determined by the claims that follow.

What is claimed is:

1. An optical device, comprising:
a first portion of one or more first gratings disposed on a substrate, the first portion corresponding to one of an input coupling region, an intermediate region, or an output coupling region, each first grating of the first portion comprising:
a first grating vector; and
a first slant angle $\vartheta'_1$ formed at a first rotation angle $\phi_1$, wherein the first rotation angle $\phi_1$ is between an etch angle t and the first grating vector; and
a second portion of one or more second gratings disposed on the substrate, the second portion corresponding to one of the input coupling region, the intermediate region, or the output coupling region that is different from the one corresponding to the first portion, each second grating of the second portion comprising:
a second grating vector, the second grating vector different than the first grating vector; and
a second slant angle $\vartheta'_2$, the second slant angle $\vartheta'_2$ different than the first slant angle $\vartheta'_1$, wherein the second slant angle $\vartheta'_2$ is formed at a second rotation angle $\phi_2$, wherein the second rotation angle $\phi_2$ is between the etch angle t and the second grating vector, the first rotation angle $\phi_1$ and the second rotation angle $\phi_2$ are selected by a system of equations $\vartheta=\arctan(\tan(\vartheta'_1)/\cos(\phi_1))$, $\vartheta=\arctan(\tan(\vartheta'_2)/\cos(\phi_2))$, and $\Delta\phi=\phi_2-\phi_1$.

2. The optical device of claim 1, wherein:
the first grating vector is a first orientation of each first grating relative to an origin of the substrate defined by the first slant angle; and the second grating vector is a second orientation of the second grating relative to the origin of the substrate defined by the second slant angle.

3. The optical device of claim 1, wherein the first slant angle and second slant angle are between 25° and 75°.

4. The optical device of claim 1, wherein each first grating and each second grating are comprised of a grating material of one or more of silicon oxycarbide (SiOC), titanium dioxide ($TiO_2$), silicon dioxide ($SiO_2$), vanadium (IV) oxide (VOx), aluminum oxide ($Al_2O_3$), indium tin oxide (ITO), zinc oxide (ZnO), tantalum pentoxide ($Ta_2O_5$), silicon nitride ($Si_3N_4$), titanium nitride (TiN), or zirconium dioxide ($ZrO_2$).

5. The optical device of claim 4, wherein the grating material of each first grating and each second grating has a refractive index between 1.5 and 2.65.

6. The optical device of claim 1, wherein a non-transparent hardmask is disposed over each first grating and each second grating.

7. The optical device of claim 1, wherein a transparent etch stop layer is disposed between the substrate and each first grating and each second grating.

8. The optical device of claim 1, wherein the etch angle $\vartheta$ corresponds to the angle of a beam.

9. The optical device of claim 8, wherein the beam is an ion beam.

10. An optical device, comprising:
a layer of grating material disposed over the substrate;
a first portion of one or more first gratings disposed in the layer of grating material over the substrate, each first grating of the first portion comprising:
a first slant angle $\vartheta'_1$ formed at a first rotation angle $\phi_1$, wherein the first rotation angle $\phi_1$ is between an etch angle t and a first grating vector; and
the first grating vector wherein the first grating vector is a first orientation of each first grating relative to an origin of the substrate defined by the first slant angle $\vartheta'_1$; and
a second portion of one or more second gratings disposed in the layer of grating material over the substrate, each second grating of the second portion comprising:
a second slant angle $\vartheta'_2$, the second slant angle $\vartheta'_2$ different than the first slant angle $\vartheta'_1$, wherein the second slant angle $\vartheta'_2$ is formed at a second rotation angle $\phi_2$, wherein the second rotation angle $\phi_2$ is between the etch angle $\vartheta$ and a second grating vector; and
the second grating vector, the second grating vector different than the first grating vector, wherein the second grating vector is a second orientation of the second grating relative to the origin of the substrate defined by the second slant angle, the first rotation angle $\phi_1$ and the second rotation angle $\phi_2$ are selected by a system of equations $\vartheta=\arctan(\tan(\vartheta'_1)/\cos(\phi_1))$, $\vartheta=\arctan(\tan(\vartheta'_2)/\cos(\phi_2))$, and $\Delta\phi=\phi_2-\phi_1$.

11. The optical device of claim 10, wherein the first slant angle and the second slant angle are between 25° and 75°.

12. The optical device of claim 10, wherein the layer of grating material includes of one or more of silicon oxycarbide (SiOC), titanium dioxide ($TiO_2$), silicon dioxide ($SiO_2$), vanadium (IV) oxide (VOx), aluminum oxide ($Al_2O_3$), indium tin oxide (ITO), zinc oxide (ZnO), tantalum pentoxide ($Ta_2O_5$), silicon nitride ($Si_3N_4$), titanium nitride (TiN), or zirconium dioxide ($ZrO_2$).

13. The optical device of claim 12, wherein the grating material of each first grating and each second grating has a refractive index between 1.5 and 2.65.

14. The optical device of claim 10, wherein a non-transparent hardmask is disposed over each first grating and each second grating.

15. The optical device of claim 10, wherein a transparent etch stop layer is disposed between the substrate and each first grating and second grating.

16. The optical device of claim 10, wherein the first portion of one or more first gratings or the second portion of one or more second gratings are disposed in the layer of grating material and in an additional layer disposed on the layer of grating material.

17. The optical device of claim 10, wherein a transparent layer is disposed between the layer of grating material and the substrate.

18. The optical device of claim 10, wherein the etch angle $\vartheta$ corresponds to the angle of a beam.

19. The optical device of claim 18, wherein the beam is an ion beam.

20. An optical device, comprising:
a first portion of one or more first gratings disposed on a substrate, each first grating of the first portion comprising:
a first grating vector; and
a first slant angle $\vartheta'_1$; and
a second portion of one or more second gratings disposed on the substrate, each second grating of the second portion comprising:
a second grating vector, the second grating vector different than the first grating vector; and
a second slant angle $\vartheta'_2$, the second slant angle $\vartheta'_2$ different than the first slant angle $\vartheta'_1$;
wherein the optical device is formed by a process comprising:
projecting an ion beam to the substrate having a grating material disposed thereon, the ion beam configured to contact the grating material at ion beam angle $\vartheta$ relative to a surface normal of the substrate, wherein:
the first portion of the substrate is positioned at a first rotation angle $\phi_1$ between the ion beam and the first grating vector of one or more first gratings to be formed by the ion beam contacting the grating material of the first portion;
the first rotation angle $\phi_1$ is selected to form the one or more first gratings with the first slant angle $\vartheta'_1$ relative to the surface normal of the substrate;
the second portion of the substrate is positioned at a second rotation angle $\phi_2$ between the ion beam and the second grating vector of one or more second gratings to be formed by the ion beam contacting the grating material; and
the second rotation angle $\phi_2$ is selected to form the one or more second gratings with the second slant angle $\vartheta'_2$ relative to the surface normal of the substrate, at least one of the first slant angle $\vartheta'_1$ and the second slant angle $\vartheta'_2$ are different than the ion beam angle t, wherein the first rotation angle $\phi_1$ and the second rotation angle $\phi_2$ are selected by a system of equations $\vartheta=\arctan(\tan(\vartheta'_1)/\cos(\phi_1))$, $\vartheta=\arctan(\tan(\vartheta'_2)/\cos(\phi_2))$, and $\Delta\phi=\phi_2-\phi_1$.

21. The optical device of claim 20, wherein the ion beam angle 9 is between 250 and 750.

22. The optical device of claim 20, wherein the grating material is comprised of one or more of silicon oxycarbide (SiOC), titanium dioxide ($TiO_2$), silicon dioxide ($SiO_2$), vanadium (IV) oxide (VOx), aluminum oxide ($Al_2O_3$), indium tin oxide (ITO), zinc oxide (ZnO), tantalum pentoxide ($Ta_2O_5$), silicon nitride ($Si_3N_4$), titanium nitride (TiN), or zirconium dioxide ($ZrO_2$).

23. The optical device of claim 20, wherein the ion beam is a ribbon beam, a spot beam, or a full substrate-size beam.

24. The optical device of claim 20, wherein the second rotation angle $\phi_2$ is different from the first rotation angle $\phi_1$.

25. The optical device of claim 20, wherein the substrate traverses the ion beam in a single pass.

\* \* \* \* \*